US011271582B2

(12) United States Patent
Lee et al.

(10) Patent No.: US 11,271,582 B2
(45) Date of Patent: Mar. 8, 2022

(54) DIGITAL-TO-ANALOG CONVERTER AND DRIVING CIRCUIT OF DISPLAY DEVICE INCLUDING THE SAME

(71) Applicants: SAMSUNG DISPLAY CO., LTD., Yongin-si (KR); Korea Advanced Institute of Science and Technology, Daejeon (KR)

(72) Inventors: Seong Joo Lee, Yongin-si (KR); Oh Jo Kwon, Yongin-si (KR); Gyeong Gu Kang, Daejeon (KR); Seok Tae Koh, Daejeon (KR); Joon Chul Goh, Yongin-si (KR); Hyun Sik Kim, Daejeon (KR); Bong Hyun You, Yongin-si (KR)

(73) Assignees: SAMSUNG DISPLAY CO., LTD., Gyeonggi-Do (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 17/168,448

(22) Filed: Feb. 5, 2021

(65) Prior Publication Data

US 2021/0359699 A1    Nov. 18, 2021

(30) Foreign Application Priority Data

May 12, 2020    (KR) ......................... 10-2020-0056709

(51) Int. Cl.
*H03M 1/66*    (2006.01)
*G09G 3/20*    (2006.01)

(52) U.S. Cl.
CPC .............. *H03M 1/662* (2013.01); *G09G 3/20* (2013.01); *G09G 2310/0291* (2013.01); *G09G 2310/0297* (2013.01)

(58) Field of Classification Search
CPC .. G09G 2310/0297; G09G 2300/0804; H03M 1/765
See application file for complete search history.

(56) References Cited

U.S. PATENT DOCUMENTS 8,054,302 B2    11/2011    Kim et al.
8,912,940 B2    12/2014    Dempsey
(Continued)

FOREIGN PATENT DOCUMENTS

KR    100813097 B1    3/2008
KR    100845746 B1    7/2008
KR    1020180133978 A    12/2018

OTHER PUBLICATIONS

Hyun-Sik Kim et al., A 10-Bit Column-Driver ICWith Parasitic-Insensitiveiterative Charge-Sharing Based Capacitor-Stringinterpolation for Mobile Active-Matrix LCDs, 2014, 17 pages, vol. 49, No. 3, IEEE Journal of Solid-State Circuits.

*Primary Examiner* — Gerald Johnson
(74) *Attorney, Agent, or Firm* — Cantor Colburn LLP (57) ABSTRACT

A digital-to-analog converter ("DAC") converts digital image data into analog image signals. The DAC includes a stage outputting different voltages to a first output terminal and a second output terminal based on a voltage supplied to a first input terminal, a voltage supplied to a second input terminal, and a first input bit. The stage includes a switch circuit including switches that are alternately turned on by a control signal, and outputting an intermediate output voltage to a third output terminal based on a first input voltage supplied to the first input terminal and a second input voltage supplied to the second input terminal, and a selector outputting one of the first input voltage and the second input voltage, and the intermediate output voltage.

19 Claims, 11 Drawing Sheets

(56) References Cited

U.S. PATENT DOCUMENTS

| | | | | |
|---|---|---|---|---|
| 2003/0137483 A1* | 7/2003 | Callway | ............ | G09G 5/363 |
| | | | | 345/101 |
| 2008/0122671 A1* | 5/2008 | Wang | ............ | H03M 1/68 |
| | | | | 341/145 |
| 2018/0358975 A1 | 12/2018 | Kwon et al. | | |

* cited by examiner

DIGITAL-TO-ANALOG CONVERTER AND DRIVING CIRCUIT OF DISPLAY DEVICE INCLUDING THE SAME

The application claims priority to Korean Patent Application No. 10-2020-0056709, filed May 12, 2020, and all the benefits accruing therefrom under 35 U.S.C. § 119, the content of which in its entirety is herein incorporated by reference.

BACKGROUND

1. Field

Embodiments of the invention relate to a display device, and more particularly, to a driving circuit and a digital-to-analog converter applied to the display device.

2. Discussion of the Related Art

A display device uses a digital-to-analog converter ("DAC") to convert a digital image signal input from outside into an analog signal to be provided to a display panel.

SUMMARY

As a resolution of the display device increases, a number of bits of a digital image signal increases. Accordingly, there is a problem in that a number and a capacity of elements for implementing a digital-to-analog converter ("DAC") are increased.

Features of the invention provide a DAC capable of enhancing versatility and reducing size and number of elements by outputting a plurality of analog voltages to an input of a single digital image signal.

Other features of the invention provide a driving circuit of a display device including the DAC.

However, the invention is not limited to the above-described features, and may be variously extended without departing from the spirit and scope of the invention.

In order to achieve the features of the invention, a DAC in an embodiment of the invention may be applied to a display device and convert digital image data into analog image signals. The DAC may include a first stage which outputs different voltages to a first output terminal and a second output terminal based on a voltage supplied to a first input terminal, a voltage supplied to a second input terminal, and a first input bit in a digital format. The first stage may include a switch circuit which includes switches that are alternately turned on by a control signal, and output an intermediate output voltage to a third output terminal based on a first input voltage supplied to the first input terminal and a second input voltage supplied to the second input terminal, and a selector which outputs one of the first input voltage and the second input voltage, and the intermediate output voltage.

In an embodiment, the selector may include a first multiplexer ("MUX") which outputs the first input voltage or the intermediate output voltage to the first output terminal in response to the first input bit, and a second MUX which outputs the intermediate output voltage or the second input voltage to the second output terminal in response to the first input bit.

In an embodiment, the switch circuit may further include a first capacitor electrically connected to the first input terminal or the second input terminal by the control signal, a second capacitor connected to the third output terminal, a first switching part connecting the first input terminal, the first capacitor, and the second capacitor based on the control signal, and a second switching part connecting the second input terminal, the first capacitor, and the second capacitor based on the control signal.

In an embodiment, when the first switching part is turned on, the first capacitor and the second capacitor may be connected in series between the first input terminal and ground.

In an embodiment, when the second switching part is turned on, the first capacitor and the second capacitor may be connected in series between the second input terminal and the ground.

In an embodiment, the intermediate output voltage may correspond to an average value of the first input voltage and the second input voltage.

In an embodiment, the control signal may be a square wave that repeats a first phase and a second phase.

In an embodiment, the first switching part may be turned on in response to the first phase of the control signal, and the second switching part may be turned on in response to the second phase of the control signal.

In an embodiment, the DAC may further include at least one stage corresponding to an input bit other than the first input bit, and dependently connected from the first stage. The first input bit may be a most significant bit.

In an embodiment, the at least one stage may include a second stage which uses the voltage output to the first output terminal as the first input voltage, the voltage output to the second output terminal as the second input voltage, and includes the selector and the switch circuit.

In an embodiment, a turn-on time of a first switching part of the second stage may be identical to a turn-on time of the second switching part of the first stage, and a turn-on time of a second switching part of the second stage may be identical to the turn-on time of the first switching part of the first stage.

In an embodiment, an inverted signal of the control signal may be supplied to the second stage.

In an embodiment, the at least one stage may include a second stage which includes the switch circuit and outputs one voltage based on outputs of a previous stage and the least significant bit.

In an embodiment, the second stage may further include a MUX controlled by the least significant bit and connected to a third output terminal of the second stage and a second input terminal of the second stage.

In an embodiment, the second stage may further include a MUX controlled by the least significant bit and connected to a third output terminal of the second stage and a first input terminal of the second stage.

In order to achieve the features of the invention, a driving circuit of a display device in an embodiment of the invention may include a DAC which converts digital image data into analog image signals, and output buffers which output data voltages to data lines based on the analog image signals. The DAC may include a switch circuit including switches that are alternately turned on by a control signal, and outputting an intermediate output voltage to a third output terminal based on a first input voltage supplied to a first input terminal and a second input voltage supplied to a second input terminal, and a selector which outputs one of the first input voltage and the second input voltage, and the intermediate output voltage based on an input bit in a digital format.

In an embodiment, the selector may include a first MUX which outputs the first input voltage or the intermediate output voltage to a first output terminal in response to the input bit, and a second MUX which outputs the intermediate output voltage or the second input voltage to a second output terminal in response to the input bit.

In an embodiment, the switch circuit may include a first capacitor electrically connected to the first input terminal or the second input terminal by the control signal, a second capacitor connected to the third output terminal, a first switching part connecting the first input terminal, the first capacitor, and the second capacitor based on the control signal, and a second switching part connecting the second input terminal, the first capacitor, and the second capacitor based on the control signal.

In an embodiment, at least one of the output buffers may interpolate and output a voltage of the first output terminal and a voltage of the second output terminal.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts.

DETAILED DESCRIPTION

Hereinafter, preferred embodiments of the invention will be described in detail with reference to the accompanying drawings. The same reference numerals are used for the same components in the drawings, and duplicate descriptions for the same components are omitted.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Figure 1:
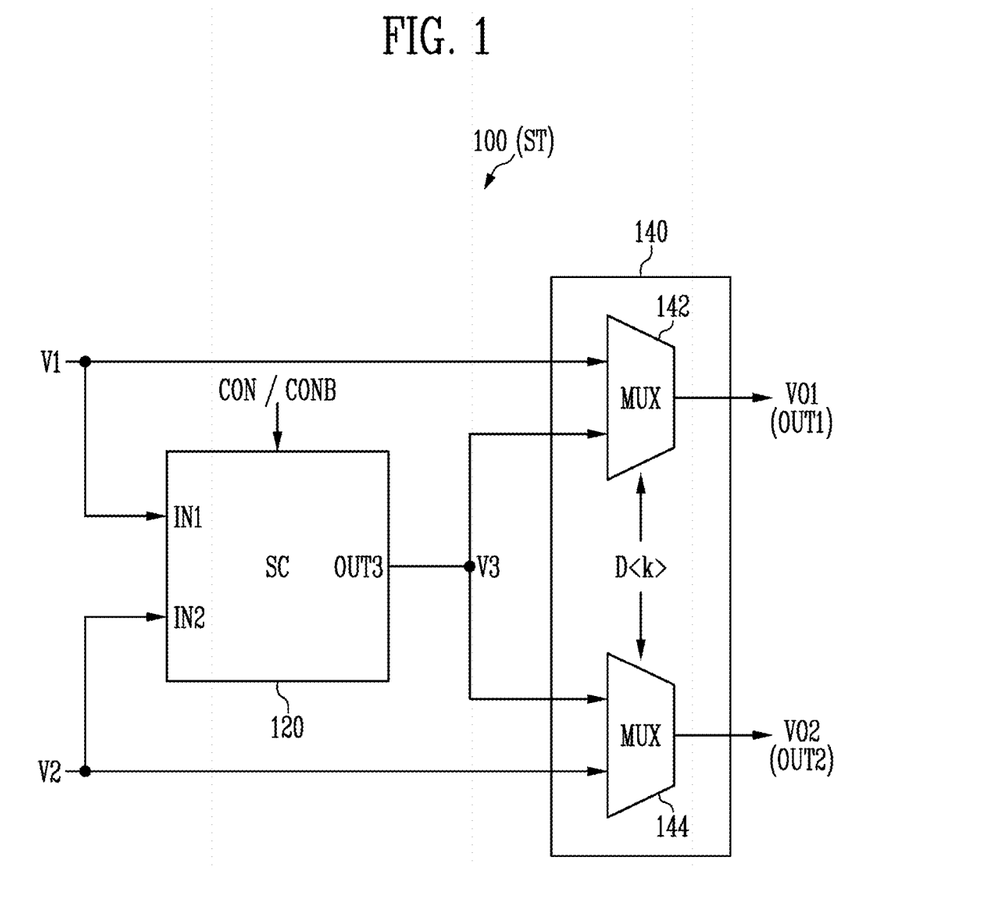
FIG. 1 is a block diagram illustrating an embodiment of a digital-to-analog converter ("DAC") according to the invention.

FIG. 1 is a block diagram illustrating an embodiment of a digital-to-analog converter ("DAC") according to the invention.

Referring to FIG. 1, a DAC 100 may include a stage ST that outputs different voltages to a first output terminal OUT1 and a second output terminal OUT2 based on a voltage supplied to a first input terminal IN1, a voltage supplied to a second input terminal IN2, and an input bit D<k>, where k is a natural number.

In an embodiment, the DAC 100 may be included in a data driver (or a driving circuit) for supplying data voltages in a display device. In addition, although only one stage ST included in the DAC 100 is shown in FIG. 1, the DAC 100 may include a plurality of stages ST. In an embodiment, the plurality of stages ST may output predetermined analog voltages corresponding to one data line connected to a pixel, for example.

The stage ST may include a switch circuit SC 120 and a selector 140.

The switch circuit SC 120 may include switches alternately turned on by a control signal CON or CONB. The switch circuit SC 120 may output an intermediate output voltage V3 to a third output terminal OUT3 based on a first input voltage V1 supplied to the first input terminal IN1 and a second input voltage V2 supplied to the second input terminal IN2. In an embodiment, the switch circuit SC 120 may output the intermediate output voltage V3 corresponding to an average value of the first input voltage V1 and the second input voltage V2 to the third output terminal OUT3, for example. In an alternative embodiment, the intermediate output voltage V3 may correspond to an intermediate value of the first input voltage V1 and the second input voltage V2.

Here, the first input voltage V1 and the second input voltage V2 may be provided from a gamma voltage generator, a power supply unit, or the like included in the display device.

The selector 140 may output one of the first input voltage V1 and the second input voltage V2, and the intermediate output voltage V3 based on the input bit D<k>. That is, the selector 140 may output two output voltages VO1 and VO2 from three voltages V1, V2, and V3.

The input bit D<k> may be a digital bit of image data corresponding to an image to be displayed. In an embodiment, each stage ST may correspond to a unit bit (1 bit) of the image data, for example. When 4-bit image data is supplied to the DAC 100, the DAC 100 may have a configuration in which four stages ST are dependently connected. A unit of the four stages ST may correspond to one data line.

In an embodiment, the selector 140 may include a first multiplexer ("MUX") 142 and a second MUX 144.

The first MUX 142 may receive the first input voltage V1 and the intermediate output voltage V3. The first MUX 142 may output the first input voltage V1 or the intermediate output voltage V3 to the first output terminal OUT1 in response to the input bit D<k>. That is, one of the first input voltage V1 and the intermediate output voltage V3 may be selected as a first output voltage VO1.

The second MUX 144 may receive the second input voltage V2 and the intermediate output voltage V3. The second MUX 144 may output the second input voltage V2 or the intermediate output voltage V3 to the second output terminal OUT2 in response to the input bit D<k>. That is, one of the second input voltage V2 and the intermediate output voltage V3 may be selected as a second output voltage VO2.

In an embodiment, the first MUX 142 and the second MUX 144 may output different voltages. In an embodiment, when the first MUX 142 outputs the intermediate output voltage V3, the second MUX 144 may output the second input voltage V2, for example. In an alternative embodiment, when the second MUX 144 outputs the intermediate output voltage V3, the first MUX 142 may output the first input voltage V1.

The input bit D<k> may include a value of 0 or 1. In an embodiment, when the input bit D<k> is 1, the first MUX 142 may select the first input voltage V1, and the second MUX 144 may select the intermediate output voltage V3, for example. When the input bit D<k> is 0, the first MUX 142 may select the intermediate output voltage V3, and the second MUX 144 may select the second input voltage V2.

As described above, the DAC 100 in the embodiments of the invention may output two voltages using three inputs. Accordingly, since the data voltages may be freely controlled by interpolating or selectively using the outputs of the DAC 100, versatility of the DAC 100 may be enhanced.

Figure 2:
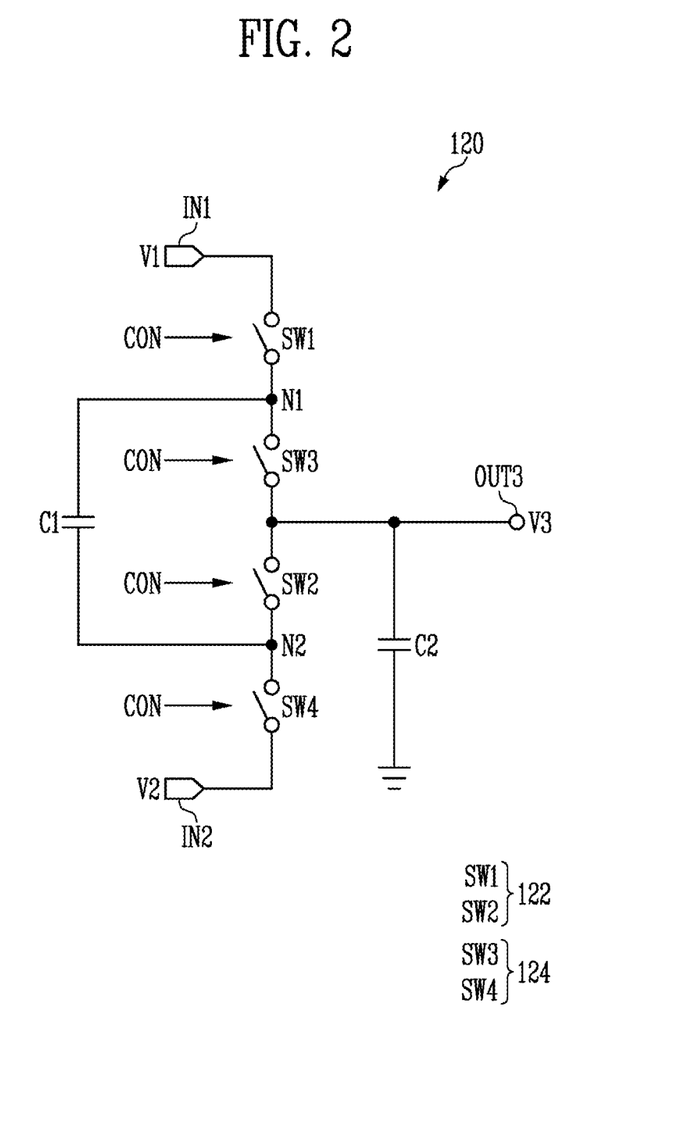
FIG. 2 is a circuit diagram illustrating an embodiment of a switch circuit included in the DAC of FIG. 1.
Figure 3:
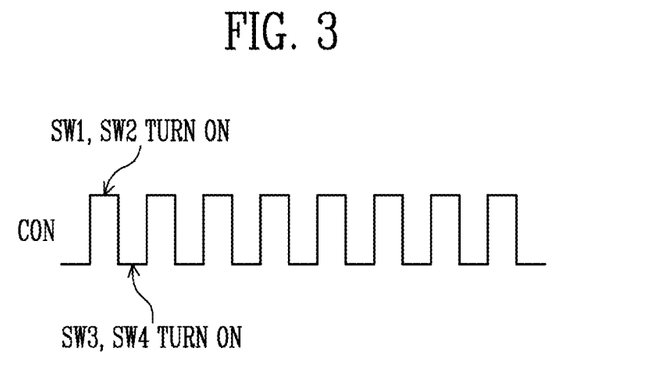
FIG. 3 is a waveform diagram illustrating an embodiment of a control signal supplied to the switch circuit of FIG. 2.

FIG. 2 is a circuit diagram illustrating an embodiment of a switch circuit included in the DAC of FIG. 1. FIG. 3 is a waveform diagram illustrating an embodiment of a control signal supplied to the switch circuit of FIG. 2.

Referring to FIGS. 1, 2 and 3, the switch circuit SC 120 may include a first capacitor C1, a second capacitor C2, a first switching part 122, and a second switching part 124.

The first capacitor C1 may be connected to the first input terminal IN1 or the second input terminal IN2 by the control signal CON. The first capacitor C1 may be connected between a first node N1 and a second node N2.

The second capacitor C2 may be connected between the third output terminal OUT3 and a predetermined voltage source. In an embodiment, the second capacitor C2 may be connected between the third output terminal OUT3 and ground, for example.

The first capacitor C1 and the second capacitor C2 may be connected in series with each other by the first and second switching parts 122 and 124. In addition, the first capacitor C1 and the second capacitor C2 may distribute the first input voltage V1 or the second input voltage V2 based on each capacitance when the first and second switching parts 122 and 124 are alternately turned on.

The first switching part 122 may connect the first input terminal IN1, the first capacitor C1, and the second capacitor C2 based on the control signal CON. In an embodiment, the first switching part 122 may include a first switch SW1 and a second switch SW2. The first switch SW1 may be connected between the first input terminal IN1 and the first node N1, and the second switch SW2 may be connected between the third output terminal OUT3 and the second node N2. When the first switching part 122 is turned on, the first capacitor C1 and the second capacitor C2 may be connected in series between the first input terminal IN1 and the ground.

The second switching part 124 may connect the second input terminal IN2, the first capacitor C1, and the second capacitor C2 based on the control signal CON. In an embodiment, the second switching part 124 may include a third switch SW3 and a fourth switch SW4. The third switch SW3 may be connected between the first node N1 and the third output terminal OUT3, and the fourth switch SW4 may be connected between the second node N2 and the second input terminal IN2. When the second switching part 124 is turned on, the first capacitor C1 and the second capacitor C2 may be connected in series between the second input terminal IN2 and the ground.

In an embodiment, as shown in FIG. 3, the control signal CON may be a square wave that repeats a first phase and a second phase. The first phase may be a logic high level, and the second phase may be a logic low level. The first and second switches SW1 and SW2 of the first switching part 122 may be turned on in response to the first phase of the control signal CON. The third and fourth switches SW3 and SW4 of the second switching part 124 may be turned on in response to the second phase of the control signal CON. That is, the first switching part 122 and the second switching part 124 may be alternately turned on and turned off each other quickly.

When the capacitance of the first capacitor C1 is C, the capacitance of the second capacitor C2 may be expressed as Equation 1 below.

$$C'=C+\Delta C \quad \text{[Equation 1]}$$

Here, C' may be the capacitance of the second capacitor C2, and ΔC may be a difference between the capacitance of the first capacitor C1 and the capacitance of the second capacitor C2.

When the first switching part 122 and the second switching part 124 alternately switch (k+1) times (where k is a natural number), the intermediate output voltage V3 may be expressed as Equation 2 below.

$$V3[k+1] = \frac{\Delta C}{C+(C+\Delta C)} \cdot V3[k] + \frac{C(V1+V2)}{C+(C+\Delta C)} \quad \text{[Equation 2]}$$

Here, V3[$k$+1] may be the intermediate output voltage V3 by a (k+1)th switching, C may be the capacitance of the first capacitor C1, ΔC may be the difference between the capacitance of the first capacitor C1 and the capacitance of the second capacitor C2, V3[$k$] may be the intermediate output voltage V3 by a k-th switching, V1 may be the first input voltage, and V2 may be the second input voltage.

When the switch circuit SC 120 switches sufficiently many times, Equation 2 may be expressed as Equation 3 below.

$$V3 = \frac{V1+V2}{2} \quad \text{[Equation 3]}$$

That is, the switch circuit SC 120 may output the average value of the first input voltage V1 and the second input voltage V2 as the intermediate output voltage V3 regardless of the difference between the capacitance of the first capacitor C1 and the capacitance of the second capacitor C2. Accordingly, the switch circuit SC 120 may output a voltage insensitive to mismatch caused by the difference between the capacitance of the first capacitor C1 and the capacitance of the second capacitor C2.

Figure 4:
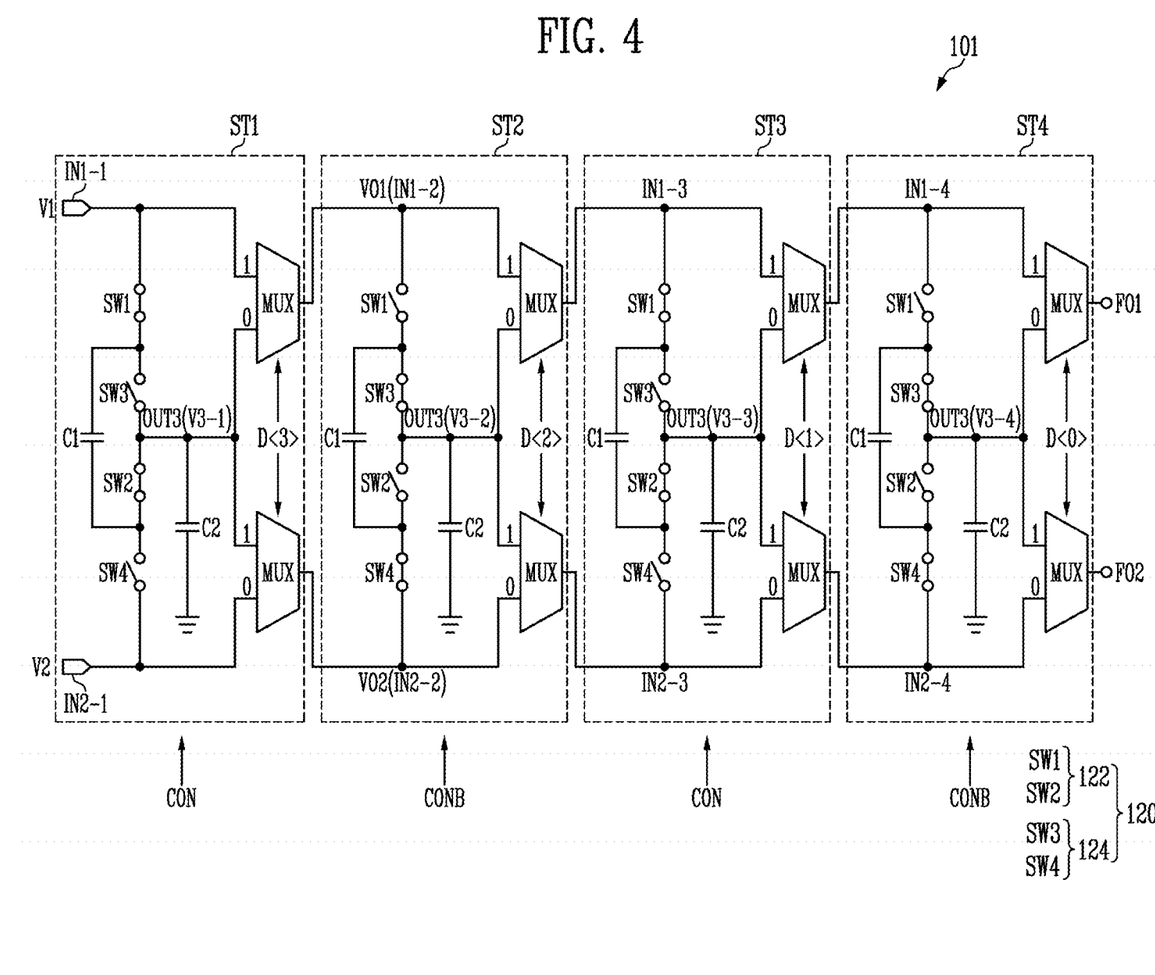
FIG. 4 is a diagram illustrating an embodiment of the DAC of FIG. 1.

FIG. 4 is a diagram illustrating an embodiment of the DAC of FIG. 1.

Referring to FIG. 4, a DAC 101 may include a plurality of stages ST1 to ST4.

FIG. 4 shows the DAC 101 that receives 4-bit input bits D<3>, D<2>, D<1>, and D<0>. Accordingly, first to fourth stages ST1 to ST4 may correspond to the input bits D<3>, D<2>, D<1>, and D<0>, respectively.

The first stage ST1 may output the first output voltage VO1 and the second output voltage VO2 in response to a first input bit D<3>. The second stage ST2 may output two output voltages in response to a second input bit D<2>. The third stage ST3 may output two output voltages in response to a third input bit D<1>. The fourth stage ST4 may output a first final voltage FO1 and a second final voltage FO2 in response to a fourth input bit D<0>.

Here, the first input bit D<3> may be the most significant bit of the input bits, and the fourth input bit D<0> may be the least significant bit of the input bits.

However, this is an example, and the number of bits of the input bits and the number of stages are not limited thereto. In an embodiment, when the input bits are eight bits, the DAC 101 may include eight stages, for example.

The first to fourth stages ST1 to ST4 may be dependently connected to each other. In an embodiment, the first output terminal OUT1 of the first stage ST1 (shown in FIG. 1) may be connected to a first input terminal IN1-2 of the second stage ST2, and the second output terminal OUT2 of the first stage ST1 (shown in FIG. 1) may be connected to a second input terminal IN2-2 of the second stage ST2. Similarly, output terminals of the second stage ST2 may be connected to input terminals IN1-3 and IN2-3 of the third stage ST3, respectively, and output terminals of the third stage ST3 may be connected to input terminals IN1-4 and IN2-4 of the fourth stage ST4, respectively. That is, output voltages of a previous stage may be supplied as input voltages of the current stage.

Each of the first to fourth stages ST1 to ST4 may include the switch circuit SC 120 and the selector 140 described with reference to FIGS. 1, 2 and 3.

In an embodiment, the control signal CON may be supplied to the first stage ST1, and an inverted signal of the control signal CON (hereinafter, an inverted control signal CONB) may be supplied to the second stage ST2. Similarly, the control signal CON may be supplied to the third stage ST3 and the inverted control signal CONB may be supplied to the fourth stage ST4. That is, the control signals CON and CONB having opposite waveforms (opposite phases) may be supplied to adjacent stages, respectively.

Accordingly, the first switching part 122 of the second stage ST2 may be turned on at the same time as the second switching part 124 of the first stage ST1, and the second switching part 124 of the second stage ST2 may be turned on at the same time as the first switching part 122 of the first stage ST1. That is, the switching parts of the adjacent stages may be switched opposite to each other.

As such, equivalent capacitance of the entire stages ST1 to ST4 may be reduced by the complementary switching operation of the adjacent stages. Accordingly, an output error caused by a change in equivalent capacitance due to switching of the switch circuits 120 may be reduced.

In addition, the first to fourth stages ST1 to ST4 may have a simple structure of the first and second capacitors C1 and C2 outputting analog voltages by the recursive repetitive switching operation. Therefore, an increase in size of the DAC 101 due to an increase in the number of input bits may be prevented, and an exponential increase in the number of elements such as capacitors may be prevented.

Furthermore, the DAC 101 may output two final voltages FO1 and FO2 in a relatively simplified structure. Therefore, additional voltage adjustment such as interpolation using the final voltages FO1 and FO2 may be possible. Accordingly, the versatility of the DAC 101 may be enhanced. The DAC 101 according to the invention may be easily applied to conditions of various display devices and data drivers (or driving circuits).

Figure 5A:
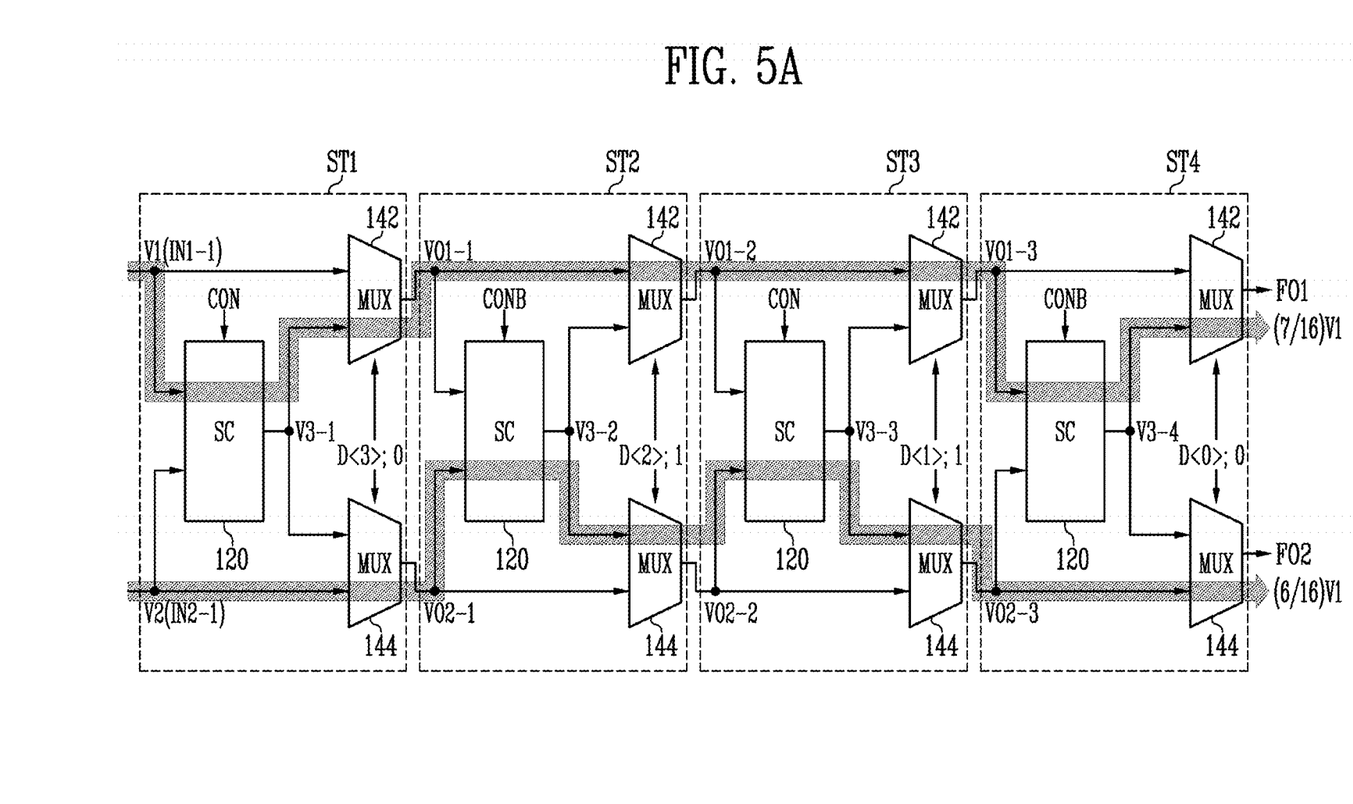
FIGS. 5A and 5B are diagrams for explaining an embodiment of an operation of the DAC of FIG. 4 according to input bits.
Figure 5B:
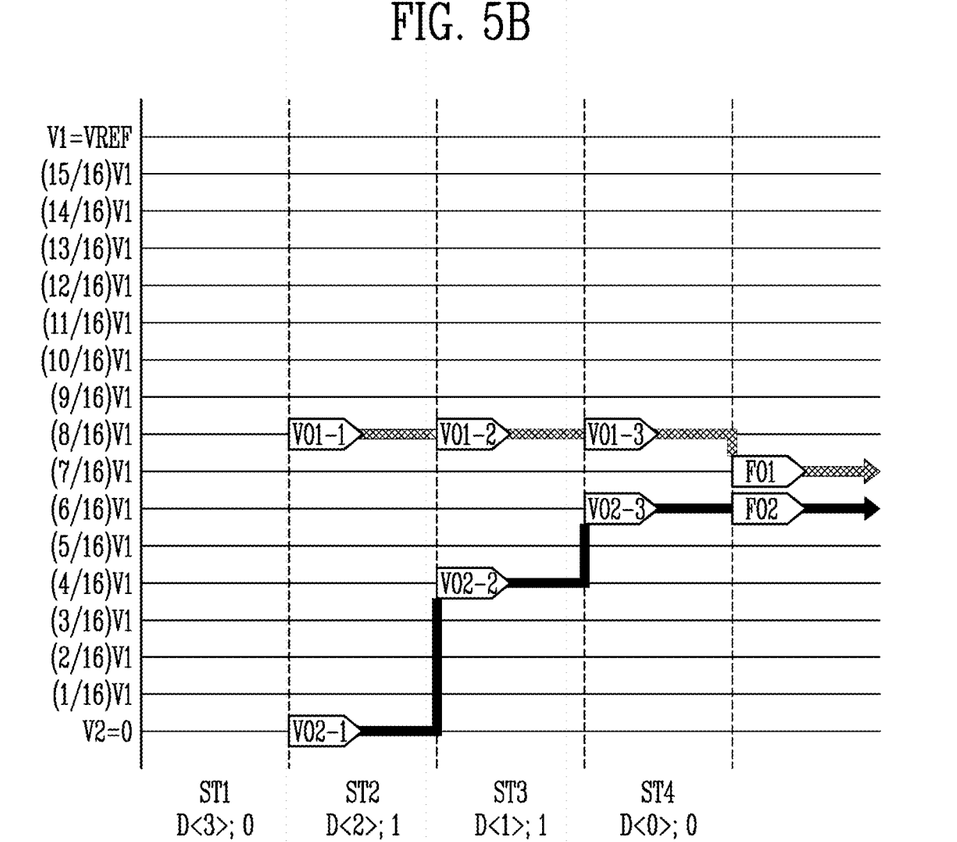

FIGS. 5A and 5B are diagrams for explaining an embodiment of an operation of the DAC of FIG. 4 according to input bits.

Referring to FIGS. 4, 5A and 5B, the input bits D<3>, D<2>, D<1>, and D<0> provided to the DAC 101 may be 0110.

In addition, the switch circuit SC 120 may output an average value of a voltage of a first input terminal IN1-1, IN1-2, IN1-3, or IN1-4 and a voltage of a second input terminal IN2-1, IN2-2, IN2-3, or IN2-4 as an intermediate output voltage V3-1, V3-2, V3-3, or V3-4.

As shown in FIGS. 5A and 5B, the first input voltage V1 may be a predetermined reference voltage VREF, and the second input voltage V2 may be 0 volt (V), for example.

When the input bit D<k> is 1, the first MUX 142 may select the voltage of the first input terminal IN1-1, IN1-2, IN1-3, or IN1-4, and the second MUX 144 may select the intermediate output voltage V3-1, V3-2, V3-3, or V3-4. When the input bit D<k> is 0, the first MUX 142 may select the intermediate output voltage V3-1, V3-2, V3-3, or V3-4, and the second MUX 144 may select the voltage of the second input terminal IN2-1, IN2-2, IN2-3, or IN2-4.

Accordingly, the DAC 101 may output voltages as shown in FIG. 5B.

Specifically, the first stage ST1 may output the intermediate output voltage V3-1 to the first output terminal (for example, OUT1 shown in FIG. 1), and the second input voltage V2 to the second output terminal (for example, OUT2 shown in FIG. 1). In other words, when the first input bit D<3> is 0 (that is, D<3>;0), a first output voltage VO1-1 of the first stage ST1 may be (8/16)V1, and a second output voltage VO2-1 of the first stage ST1 may be 0.

When the second input bit D<2> is 1 (that is, D<2>;1), a first output voltage VO1-2 of the second stage ST2 may be (8/16)V1, and a second output voltage VO2-2 of the second stage ST2 may be (4/16)V1.

When the third input bit D<1> is 1 (that is, D<1>;1), a first output voltage VO1-3 of the third stage ST3 may be (8/16) V1, and a second output voltage VO2-3 of the third stage ST3 may be (6/16)V1.

When the fourth input bit D<0> is 0 (that is, D<0>;0), a first output voltage (that is, the first final voltage FO1) of the fourth stage ST4 may be (7/16)V1, and a second output voltage (that is, the second final voltage FO2) of the fourth stage ST4 may be (6/16)V1.

As such, the DAC 101 in the embodiments of the invention may finally output two analog voltages corresponding to a difference in the number of bits of the least significant bit. Therefore, outputs of the analog voltages may be further subdivided.

Also, in the embodiments of the invention, there may be a bypass period such as a period in which the second input voltage V2 is output from the first stage ST1 as it is. Therefore, the speed of converting digital values to analog voltages may be increased. Accordingly, the DAC 101 in the embodiments of the invention may be easily applied to a data driving circuit requiring a high scanning rate of high speed.

Figure 6A:
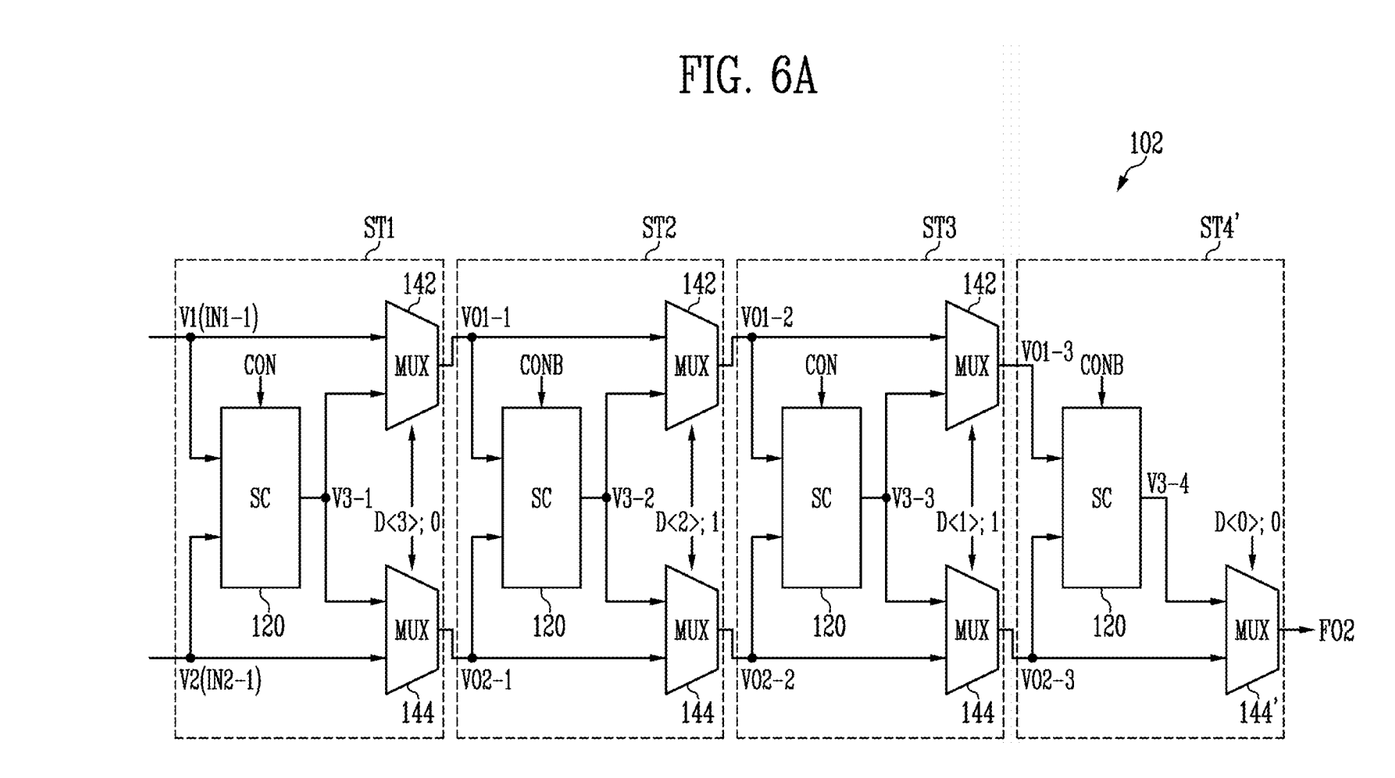
FIG. 6A is a diagram illustrating another embodiment of the DAC of FIG. 1.

FIG. 6A is a diagram illustrating another embodiment of the DAC of FIG. 1.

Referring to FIGS. 4 to 6A, a fourth stage ST4' corresponding to the least significant bit D<0> may include one MUX 144'.

The MUX 144' may be controlled by the least significant bit D<0>. In an embodiment, the MUX 144' may be connected to a third output terminal V3-4 of the fourth stage ST4 and the second input terminal (IN2-4 shown in FIG. 4) of the fourth stage ST4.

Therefore, a DAC 102 may only output the second final voltage FO2. In an embodiment, when the input of FIG. 5B is applied to the DAC 102, the DAC 102 may output a voltage of (6/16)V1, for example.

Figure 6B:
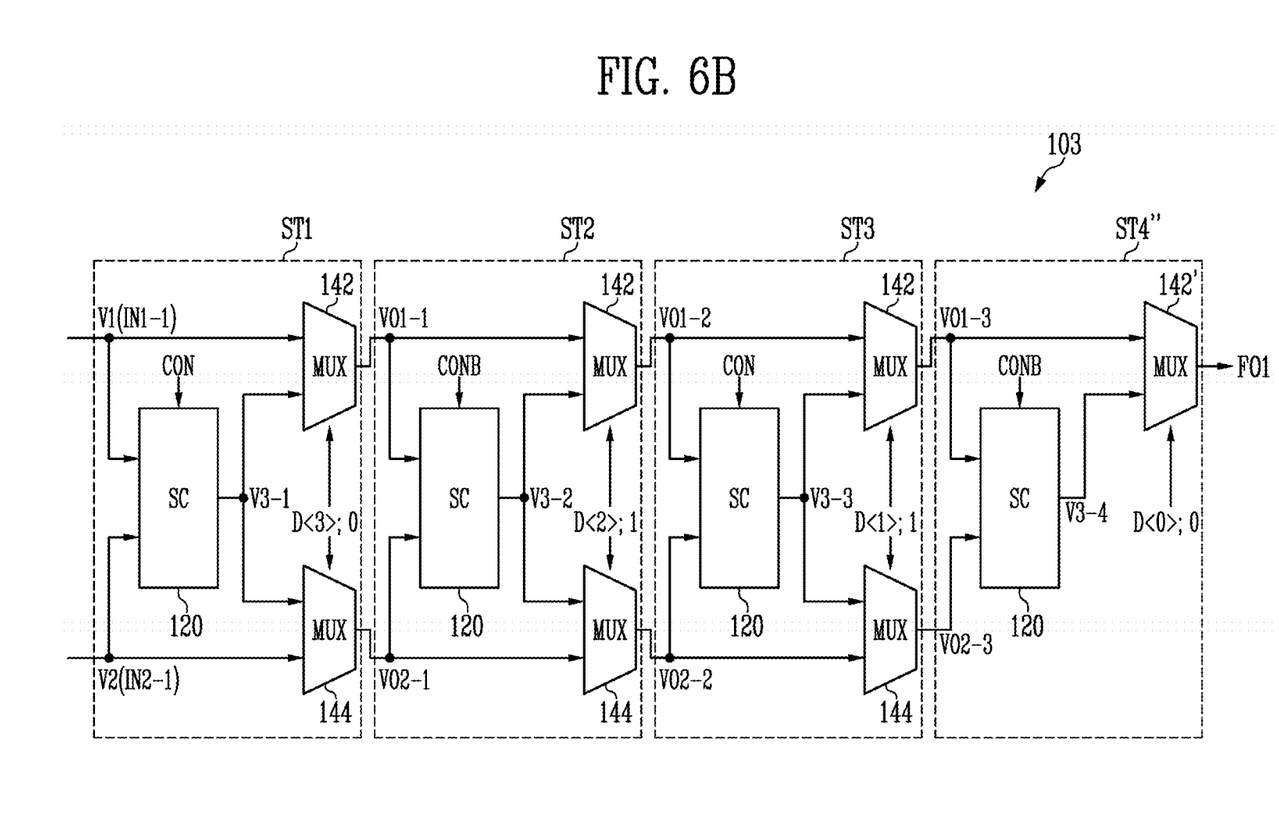
FIG. 6B is a diagram illustrating still another embodiment of the DAC of FIG. 1.

FIG. 6B is a diagram illustrating still another embodiment of the DAC of FIG. 1.

Referring to FIGS. 4 to 6B, a fourth stage ST4" corresponding to the least significant bit D<0> may include one MUX 142'.

The MUX 142' may be controlled by the least significant bit D<0>. In an embodiment, the MUX 142' may be connected to the third output terminal V3-4 of the fourth stage ST4 and the first input terminal (IN1-4 shown in FIG. 4) of the fourth stage ST4.

Therefore, a DAC 103 may only output the first final voltage FO1. In an embodiment, when the input of FIG. 5B is applied to the DAC 103, the DAC 103 may output a voltage of (7/16)V1, for example.

Figure 7:
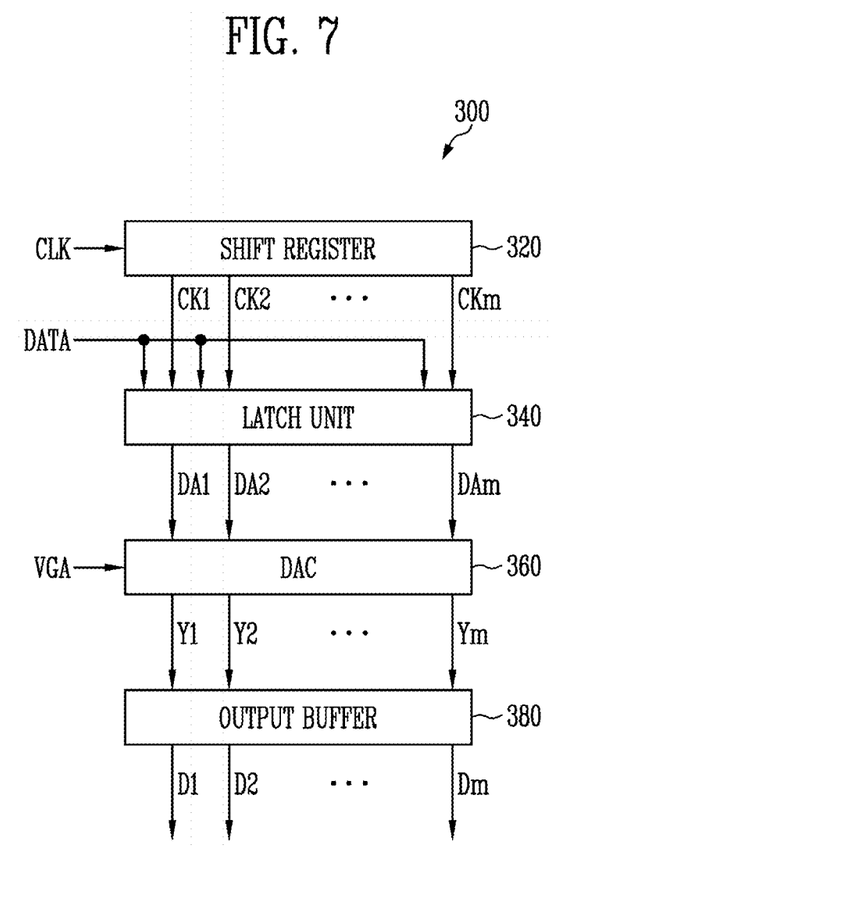
FIG. 7 is a block diagram illustrating an embodiment of a driving circuit of a display device according to the invention.

FIG. 7 is a block diagram illustrating an embodiment of a driving circuit of a display device according to the invention.

Referring to FIG. 7, a driving circuit 300 of a display device may include a shift register 320, a latch unit 340, a DAC 360, and an output buffer 380.

The shift register 320 may sequentially activate latch clock signals CK1, CK2, . . . , and CKm in synchronized with a clock signal CLK where m is a natural number.

The latch unit 340 may receive the latch clock signals CK1, CK2, . . . , and CKm from the shift register 320 and latch image signals DATA of a digital format in synchronized with the latch clock signals CK1, CK2, . . . , and CKm. In addition, the latch unit 340 may simultaneously provide latched digital image data DA1, DA2, . . . , and DAm to the DAC 360 in response to a line latch signal.

The DAC 360 may convert the digital image data DA1, DA2, . . . , and DAm into analog image signals Y1, Y2, . . . , and Ym, respectively. The DAC 360 may receive a gamma voltage VGA supplied from the gamma voltage generator, and convert the digital image data DA1, DA2, . . . , and DAm into the analog image signals Y1, Y2, . . . , and Ym. In addition, the DAC 360 may output the analog image signals Y1, Y2, . . . , and Ym to the output buffer 380.

The DAC 360 may include the stage including the switch circuit and the selector. The switch circuit may include the switches alternately turned on by the control signal, and output the intermediate output voltage to the third output terminal based on the first input voltage supplied to the first input terminal and the second input voltage supplied to the second input terminal. The selector may output one of the first input voltage and the second input voltage, and the intermediate output voltage based on the input bit.

The DAC 360 may further include the stage ST of FIG. 1 according to the number of bits of the digital image data DA1, DA2, . . . , and DAm.

Since the configuration and operation of the DAC 360 are the same or similar to those described in detail with reference to FIGS. 1 to 6B, redundant description will be omitted.

The output buffer 380 may output a plurality of analog image signals Y1, Y2, . . . , and Ym to a plurality of data lines D1, D2, . . . , and Dm, respectively. In FIG. 7, the analog image signals Y1, Y2, . . . , and Ym and the data lines D1, D2, . . . , and Dm are shown to correspond one-to-one. In this case, the DAC 360 may include the structures of FIG. 6A and/or FIG. 6B. In an embodiment, the DAC (for example, 102 shown in FIG. 6A) corresponding to a first data line D1 may output only one final voltage, for example.

As described above, the driving circuit 300 of the display device in the embodiments of the invention may include the stages having the simple structure of the first and second capacitors C1 and C2 outputting the analog voltages by the recursive repetitive switching operation. Therefore, an increase in size of the DAC 360 due to an increase in the number of input bits may be prevented, and an exponential increase in the number of elements such as capacitors may be prevented.

Figure 8:
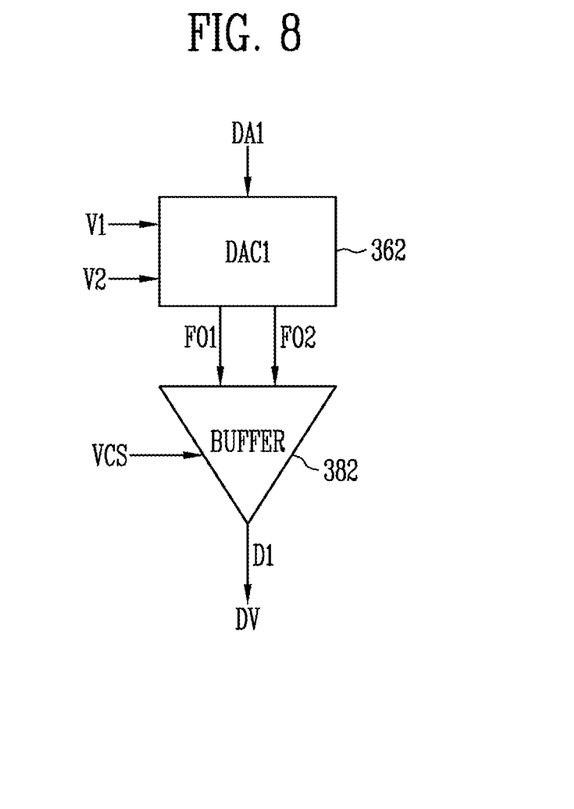
FIG. 8 is a block diagram illustrating an embodiment of a DAC and a buffer included in the driving circuit of FIG. 7.

FIG. 8 is a block diagram illustrating an embodiment of a first DAC member and a first output buffer member included in the driving circuit of FIG. 7.

Referring to FIGS. 1, 7 and 8, a first DAC member DAC1 362 may output the first and second final voltages FO1 and FO2, and a first output buffer member BUF1 382 may supply a data signal DV to the data line D1 using the first and second final voltages FO1 and FO2.

The first DAC member DAC1 362 may have the structure described with reference to FIGS. 1 to 5B. The first DAC member DAC1 362 may receive the first input voltage V1 and the second input voltage V2. The first DAC member DAC1 362 may output the first and second final voltages FO1 and FO2 corresponding to the input bit of a digital image signal DA1.

The first output buffer member BUF1 382 may generate a data voltage DV from the first and second final voltages FO1 and FO2. In an embodiment, the first output buffer member BUF1 382 may interpolate the first final voltage FO1 and the second final voltage FO2 based on a voltage control signal VCS. In an embodiment, the first output buffer member BUF1 382 may include various types of known interpolation circuits, and may output a voltage between the first final voltage FO1 and the second final voltage FO2 based on the voltage control signal VCS, for example.

In an embodiment, the first output buffer member BUF1 382 may select and output one of the first final voltage FO1 and the second final voltage FO2 based on the voltage control signal VCS.

As such, since the first DAC member DAC1 362 may output two final voltages FO1 and FO2 in a relatively simplified structure, the first DAC member DAC1 362 may be compatible with an output buffer including an interpolation circuit or the like. Accordingly, versatility of the first DAC member DAC1 362 may be enhanced, and the analog voltages output from the driving circuit 300 may be further subdivided.

Figure 9:
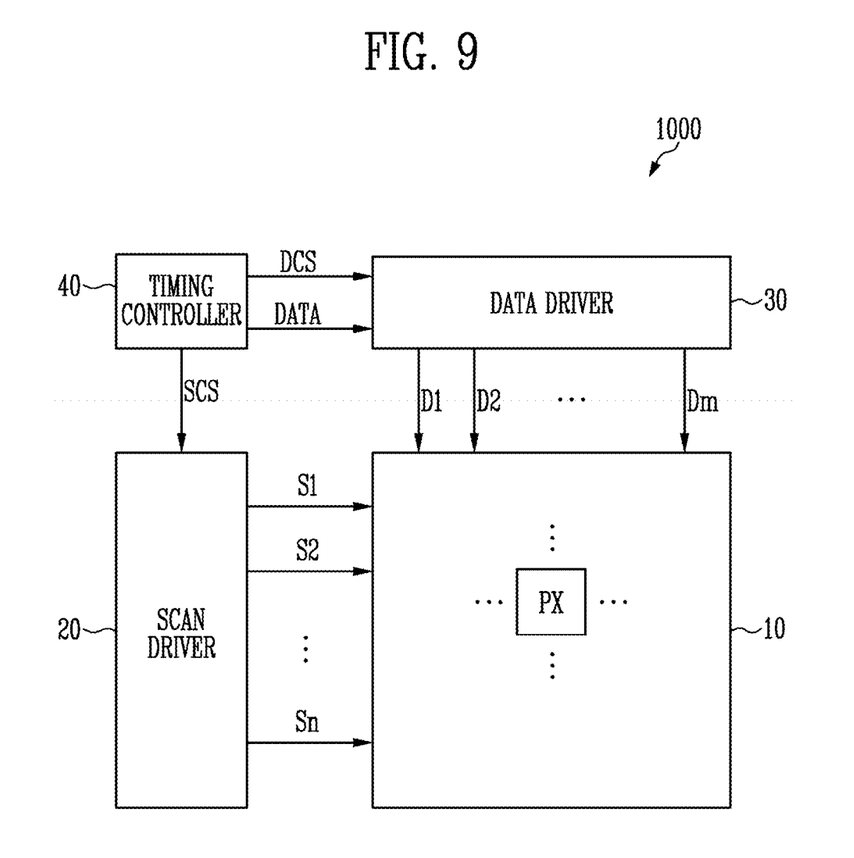
FIG. 9 is a block diagram illustrating an embodiment of the display device according to the invention.

FIG. 9 is a block diagram illustrating an embodiment of the display device according to the invention.

Referring to FIG. 9, a display device 1000 may include a pixel unit 10, a scan driver 20, a data driver 30, and a timing controller 40.

The pixel unit 10 may include a plurality of pixels PX. The pixels PX may be connected to scan lines S1, S2, . . . , and Sn and the data lines D1, D2, . . . , and Dm where n and m are natural numbers.

The timing controller 40 may generate a data control signal DCS for controlling the data driver 30 and a scan control signal SCS for controlling the scan driver 20. The data control signal DCS may include a clock signal supplied to a shift register of the data driver 30 and the line latch signal supplied to the latch unit. In addition, the timing controller 40 may provide image data of a digital format to the data driver 30.

The scan driver 20 may supply scan signals to the pixels PX through the scan lines S1, S2, . . . , and Sn in response to the scan control signal SCS.

The data driver 30 may supply the data signals (data voltages) to the pixels PX through the data lines D1, D2, . . . , and Dm according to the scan signals. In an embodiment, the data driver 30 may include the driving circuit 300 of FIG. 7 and/or FIG. 8. The configurations of the driving circuit, the DAC, and the output buffer included therein have been described in detail with reference to FIGS. 1 to 8, and thus description of the overlapped contents will be omitted.

The DAC in the embodiments of the invention may include the capacitors outputting the analog voltages by the recursive repetitive switching operation (simple structure). Therefore, an increase in size of the DAC and an exponential increase in the number of elements such as capacitors due to an increase in the number of input bits may be prevented. In addition, an output error of the DAC may be reduced, and the speed of converting voltages may be increased. Accordingly, the DAC may be applied to a high frequency/high resolution display device.

Furthermore, the DAC may output two final voltages in the relatively simplified structure. Therefore, additional voltage adjustment, such as interpolation using the final voltages, may be possible. Accordingly, the analog voltages output from the DAC and the driving circuit including the same may be further subdivided. In addition, the DAC and the driving circuit including the same may be easily applied to conditions of various display devices by enhancing versatility.

However, effects of the invention are not limited to the above-described effects, and may be variously extended without departing from the spirit and scope of the invention.

As described above, preferred embodiments of the invention have been described with reference to the drawings. However, those skilled in the art will appreciate that various modifications and changes may be made to the invention.

What is claimed is:

1. A digital-to-analog converter which is applied to a display device and converts digital image data into analog image signals, the digital-to-analog converter comprising:
    a first stage which outputs different voltages to a first output terminal and a second output terminal based on a voltage supplied to a first input terminal, a voltage supplied to a second input terminal, and a first input bit in a digital format, the first stage comprising:
        a switch circuit which includes switches which are alternately turned on by a control signal, and output an intermediate output voltage to a third output terminal based on a first input voltage supplied to the first input terminal and a second input voltage supplied to the second input terminal; and
        a selector which outputs one of the first input voltage and the second input voltage, and the intermediate output voltage.

2. The digital-to-analog converter of claim 1, wherein the selector comprises:
    a first multiplexer which outputs the first input voltage or the intermediate output voltage to the first output terminal in response to the first input bit; and
    a second multiplexer which outputs the intermediate output voltage or the second input voltage to the second output terminal in response to the first input bit.

3. The digital-to-analog converter of claim 2, wherein the switch circuit further includes:
    a first capacitor electrically connected to the first input terminal or the second input terminal by the control signal;
    a second capacitor connected to the third output terminal;
    a first switching part connecting the first input terminal, the first capacitor, and the second capacitor based on the control signal; and
    a second switching part connecting the second input terminal, the first capacitor, and the second capacitor based on the control signal.

4. The digital-to-analog converter of claim 3, wherein when the first switching part is turned on, the first capacitor and the second capacitor are connected in series between the first input terminal and a ground.

5. The digital-to-analog converter of claim 3, wherein when the second switching part is turned on, the first capacitor and the second capacitor are connected in series between the second input terminal and a ground.

6. The digital-to-analog converter of claim 3, wherein the intermediate output voltage corresponds to an average value of the first input voltage and the second input voltage.

7. The digital-to-analog converter of claim 3, wherein the control signal is a square wave which repeats a first phase and a second phase.

8. The digital-to-analog converter of claim 7, wherein the first switching part is turned on in response to the first phase of the control signal, and the second switching part is turned on in response to the second phase of the control signal.

9. The digital-to-analog converter of claim 7, further comprising:
at least one stage corresponding to an input bit other than the first input bit, and dependently connected from the first stage,
wherein the first input bit is a most significant bit.

10. The digital-to-analog converter of claim 9, wherein the at least one stage comprises:
a second stage which uses the voltage output to the first output terminal as the first input voltage, the voltage output to the second output terminal as the second input voltage, and includes the selector and the switch circuit.

11. The digital-to-analog converter of claim 10, wherein a turn-on time of a first switching part of the second stage is identical to a turn-on time of the second switching part of the first stage, and
wherein a turn-on time of a second switching part of the second stage is identical to the turn-on time of the first switching part of the first stage.

12. The digital-to-analog converter of claim 10, wherein an inverted signal of the control signal is supplied to the second stage.

13. The digital-to-analog converter of claim 9, wherein the at least one stage comprises:
a second stage which includes the switch circuit and outputs a voltage based on outputs of a previous stage and a least significant bit.

14. The digital-to-analog converter of claim 13, wherein the second stage further includes:
a multiplexer controlled by the least significant bit and connected to a third output terminal of the second stage and a second input terminal of the second stage.

15. The digital-to-analog converter of claim 13, wherein the second stage further includes:
a multiplexer controlled by the least significant bit and connected to a third output terminal of the second stage and a first input terminal of the second stage.

16. A driving circuit of a display device comprising:
a digital-to-analog converter which converts digital image data into analog image signals; and
output buffers which output data voltages to data lines based on the analog image signals, the digital-to-analog converter comprising:
a switch circuit which includes switches which are alternately turned on by a control signal, and output an intermediate output voltage to a third output terminal based on a first input voltage supplied to a first input terminal and a second input voltage supplied to a second input terminal; and
a selector which outputs one of the first input voltage and the second input voltage, and the intermediate output voltage based on an input bit in a digital format.

17. The driving circuit of claim 16, wherein the selector comprises:
a first multiplexer which outputs the first input voltage or the intermediate output voltage to a first output terminal in response to the input bit; and
a second multiplexer which outputs the intermediate output voltage or the second input voltage to a second output terminal in response to the input bit.

18. The driving circuit of claim 17, wherein the switch circuit further includes:
a first capacitor electrically connected to the first input terminal or the second input terminal by the control signal;
a second capacitor connected to the third output terminal;
a first switching part connecting the first input terminal, the first capacitor, and the second capacitor based on the control signal; and
a second switching part connecting the second input terminal, the first capacitor, and the second capacitor based on the control signal.

19. The driving circuit of claim 17, wherein at least one of the output buffers interpolates a voltage of the first output terminal and a voltage of the second output terminal.

* * * * *